United States Patent [19]

Fujimoto

[11] Patent Number: 5,043,729

[45] Date of Patent: Aug. 27, 1991

[54] DECODER FOR DELTA-MODULATED CODE

[75] Inventor: Yoshiji Fujimoto, Nara, Japan

[73] Assignee: Sharp Kabushiki Kaisha, Osaka, Japan

[21] Appl. No.: 580,353

[22] Filed: Sep. 7, 1990

Related U.S. Application Data

[63] Continuation of Ser. No. 222,769, Jul. 22, 1988, abandoned.

[30] Foreign Application Priority Data

Jul. 24, 1987 [JP] Japan ............................. 62-186357

[51] Int. Cl.$^5$ ............................................. H03M 1/82
[52] U.S. Cl. ......................................... 341/152; 341/77; 341/143; 375/25
[58] Field of Search ............... 341/61, 77, 75, 76, 341/143, 152; 375/22, 25, 27, 28, 29; 332/11 D

[56] References Cited

U.S. PATENT DOCUMENTS 3,937,897 2/1976 Song ......................................... 341/75
3,956,700 5/1976 Condon .................................. 341/143
4,035,724 7/1977 Stephenne et al. .................... 341/61
4,044,306 8/1977 Villeret et al. ......................... 341/61

Primary Examiner—A. D. Pellinen
Assistant Examiner—Brian Young

[57] ABSTRACT

A decoder for decoding a delta-modulated code represented with binary digit "1" or "0" to convert it into an analog signal, wherein when the delta-modulated code takes the first value ("1" or "0"), a positive pulse signal is applied to an integrator to increase its accumulated value by a constant value and when the delta-modulated code takes the second value ("0" or "1"), a negative pulse signal is appied to the integrator to decrease its accumulated value by the constant value, and this accumulated value of the integrator is outputted as an analog signal which corresponds to a code train of the delta-modulated code. The decoder is characterized in that it has a pulse width modulater which limits an effective pulse width of the pulse signal by performing pulse width modulation of the positive or negative pulse signal in response to a control signal.

18 Claims, 6 Drawing Sheets

DECODER FOR DELTA-MODULATED CODE

This application is a continuation of application Ser. No. 222,769 filed on July 22, 1988, now abandoned.

BACKGROUND OF THE INVENTION

This invention relates to a decoder for a delta-modulated code and, more particularly, to the same which decodes the delta-modulated code obtained from delta modulation of an analog signal to convert it into an original analog signal.

The delta modulation coding system is a coding system which utilizes very simple hardware that does not require an A/D converter and is useful for digitization of, for example, audio signals.

FIG. 13 is a circuit configuration showing a conventional delta modulation system. An analog signal is inputted to an input terminal 101 and is passed through a low pass filter 102 designed to cut high frequency components and thus limit the pass bandwidth. An analog signal with limited bandwidth is passed through a coupling capacitor 103 in order to supply its alternating components to a plus input terminal of a comparator 107. A resistance 105 and a variable resistor 106 are included and determine a direct current voltage level of an input signal line 104 and this voltage level is set generally at ½ of the power supply voltage Vcc. An output signal from a flip-flop 108 is integrated by a resistance 110 and a capacitor 111 and the integrated signal is supplied to a minus input terminal of the comparator 107 through a signal input line 112. The comparator 107 compares magnitudes of the two inputted signals and outputs a high voltage (high level) at its output terminal when the signal at the plus terminal is larger, or outputs a low voltage (low level) when the signal at the minus terminal is larger respectively. The output of the comparator 107 is supplied to an input of the flip-flop 108. The flip-flop 108 receives the output signal of the comparator 107 in synchronization with a clock signal applied to a clock terminal 109 and outputs nearly the same high level as the input (voltage approximately equal to Vcc) or the same low level (the grounded voltage, usually 0 volt) and holds the condition as it is until arrival of the next clock. The output voltage of the flip-flop 108 and the relatively high resistance 110 configure a dummy constant current source, and thereby the capacitor 111 is charged up.

Now, signal waveforms on two signal lines 104 and 112 of the comparator 107 are shown in FIG. 14. When a signal 200 is applied to the input signal line 104, a signal waveform on the input signal line 112 becomes as shown with numeral 201. At this time, a delta-modulated code train 202 is outputted at the output terminal of the flip-flop 108. This signal is processed in a digital signal processing portion 113.

An output signal of the delta-modulated code of the digital signal processing portion 113 is supplied to a flip-flop 114 to be received in synchronization with a clock signal applied at a clock terminal 115. An output of the flip-flop 114 is integrated by a relatively high resistance 116 and a capacitor 117 to convert it into an analog signal. When the output of the flip-flop 114 is a code train 202, a signal waveform 201 is obtained as shown in FIG. 14. This signal is formed in stairs and is smoothed by an analog low pass filter 119 and then an analog signal is outputted at an output terminal 120.

Now, in the digital signal processing portion 113, the signal is passed through a digital low pass filter and then is decimated (processing of lowering a sampling frequency) and is converted into a normal PCM (Pulse Code Modulation) code and thereafter is subjected to a variety of processing. However, when an inputted signal waveform is outputted as it is in such a case as digital delay, conversion of the signal into PCM code is not necessary.

The delta modulated code obtained in the above delta modulation coding system is a code train of "1" and "0". In order to perform the normal digital signal processing of "1" and "0", the decimation with the digital low pass filter and the conversion of the signal into the usual PCM signal is required. Therefore, there is a problem in which the required circuit configuration becomes complicated and expensive.

SUMMARY OF THE INVENTION

The present invention has been made to solve the above problem, and therefore it is an object of the present invention to provide a decoder for delta-modulated code which can perform, for example, product and sum operations which ar .he basis of digital signal processing in the decoding stage without converting the delta-modulated code into a PCM signal, by using very simple hardware.

The decoder for a delta-modulated code according to the invention is for decoding the delta-modulated code that is represented with the binary digit "1" or "0" into an analog signal. When the deltamodulated code is the first value ("1" or "0"), a positive pulse signal is given to an integrator to increase its accumulated value by a constant value and when the delta-modulated code is the second value ("0" or "1"), a negative pulse signal is given to the integrator to decrease its accumulated value by the constant value, and this accumulated value of the integrator is outputted as an analog signal which corresponds to a delta-modulated code train. In this decoder, a positive or negative pulse signal is pulse-width-modulated in response to a control signal to supply it to the integrator to perform product and sum operations with simple hardware.

In the present invention, the pulse width modulation means limits an effective pulse width of the positive or negative pulse signal in response to the control signal, thereby varying an increase or decrease value in increasing or decreasing an integrator accumulated value in response to a logical value of the delta-modulated code, and thus an amplitude of an analog output signal corresponding to the delta-modulated code train is varied. As a result of this processing, the amplitude of the above analog output signal becomes an inputted delta-modulated code multiplied by a predetermined value corresponding to the above control signal.

As mentioned above, according to the present invention, the product and sum operations which constitute the basis of the digital signal processing are performed by a very simple circuit configuration in decoding of the delta-modulated code. Among other things, the multiplier in the product and sum operations can be varied in response to the control signal given to the pulse width modulation means, therefore, this enables dynamic processing of the signal. Accordingly, this technology can be applied to a digital attenuator, mixing of a plurality of signals, or fade-in fade-out of two signals.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Figure 13:
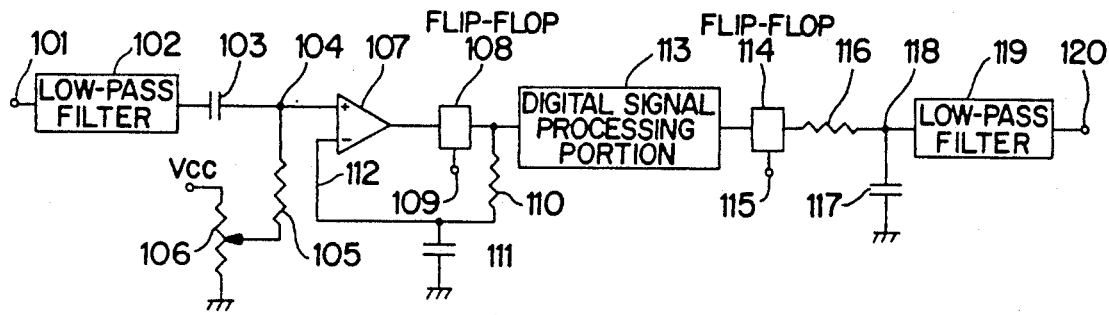
FIG. 13 shows one example of a circuit configuration of a conventional delta modulation coding system.

In the conventional device shown in FIG. 13, the output signal pulse from a flip-flop 114 on the decoding side is integrated by a resistance 116 and a capacitance 117 to convert it into an analog signal. By pulse width modulation of the output signal pulse from this flip-flop 114, the effective pulse width of the output pulse is controlled, thereby, a charge quantity to be integrated is controlled by charging time. Narrowing the effective pulse width less than the original pulse width is equivalent to multiplication of an amplitude of the output waveform by a numerical value less than one. For example, by narrowing the pulse width to ½, the amplitude of the output waveform can be reduced to ½. Addition in the product and sum operations is implemented by constituting constant current sources by passing each output signal of a plurality of the flip-flops through each relatively high resistance and connecting these to the same terminal. Further, for control of the pulse width of the flip-flop 114, a tri-state output buffer gate is used, thereby greatly simplifying the circuit configuration.

Figure 1:
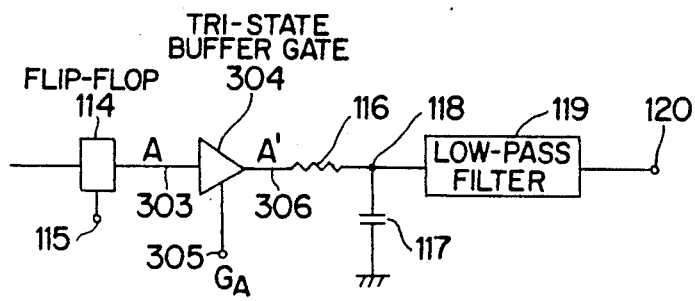
FIG. 1 is a circuit diagram showing a first embodiment of the present invention.

FIG. 1 is a circuit diagram showing a first embodiment of the present invention. This embodiment is configured for the decoding portion (114–120) of the conventional device of FIG. 13 by adding a pulse width modulation circuit that is the feature of this embodiment, which decoding portion converts the delta-modulated code into the analog signal.

Now, the circuit added between the flip-flop 114 and the resistance 116 is the tri-state buffer gate 304. This tri-state buffer gate 304 outputs the input signal as it is when a signal GA at a control input 305 is "H" (high level). The output terminal assumes a high impedance ("Z") level regardless of the input signal when the signal GA is "L" (low level).

Figure 2:
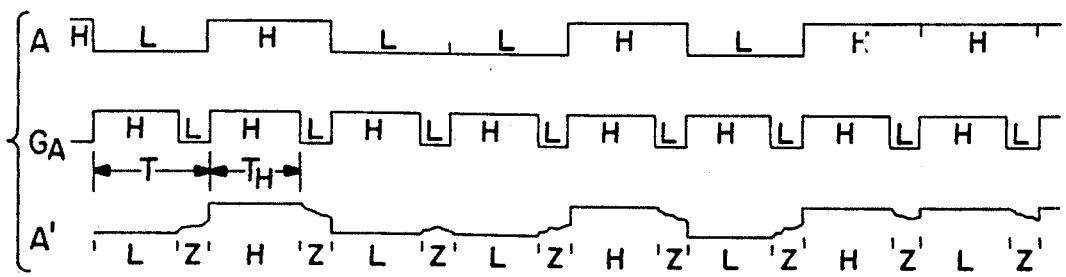
FIG. 2 shows signal waveforms at each part of the circuit of FIG. 1.
Figure 14:
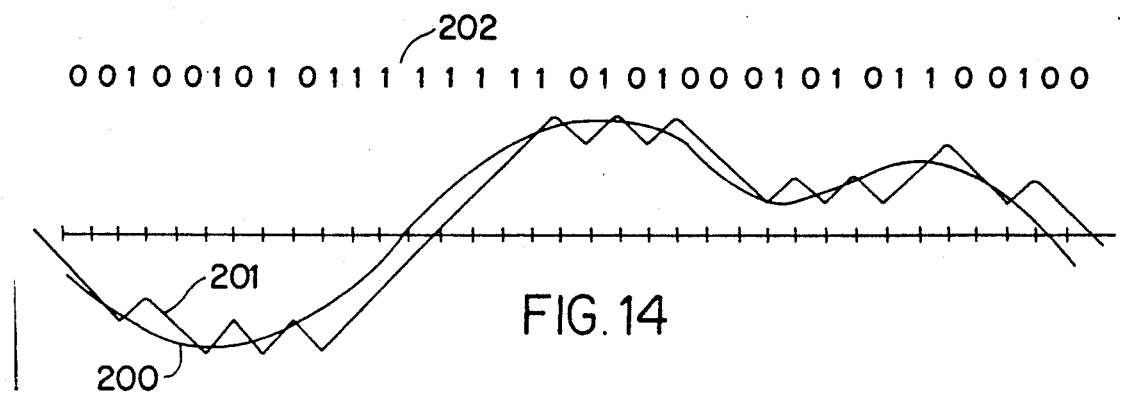
FIG. 14 shows signal waveforms for explaining an operation of the circuit of FIG. 13.
Figure 3:
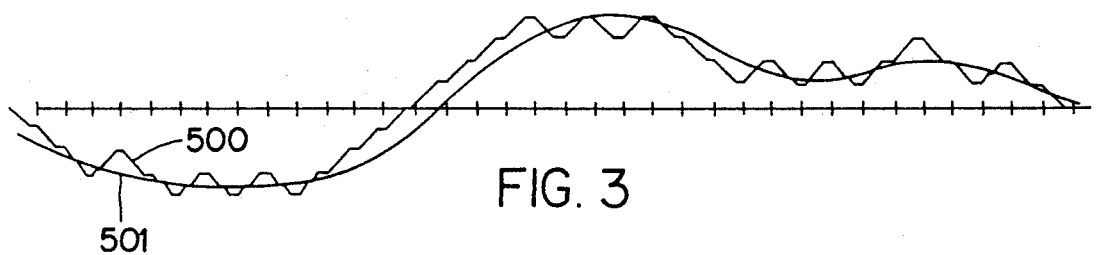
FIG. 3 shows one example of the waveforms subjected to attenuation by pulse width modulation.

Now, assuming that the output signal A of the flip-flop 114 which is supplied to the input of the buffer gate 304 and the control signal GA which is supplied to the control input of the buffer gate 304 have each signal waveform as shown in FIG. 2, an output signal A' waveform of the buffer gate 304 becomes A' in FIG. 2. Further, the output of the buffer gate 304 becomes "Z" (high impedance) when the control signal GA is "L". The output of the buffer gate 304 forms a constant current source with the resistance 116 when the signal A' is "H" or "L" and it charges or discharges the capacitor 117, but a current does not flow when the buffer gate 304 is "Z" and so a voltage of the capacitor 117 does not change. Therefore, an amount of charge which is charged or discharged to or from the capacitor 117 becomes small and thus an amplitude of the analog output signal becomes small. For example, when the signal A on the signal input line 303 of the buffer gate 304 is equal to the code train 202 of FIG. 14 and the control signal GA for the buffer gate 304 has "L" level during ¼ clock period as shown in FIG. 2, a waveform 500 shown in FIG. 3 is obtained on the signal input line 118 of the low pass filter 119. The amplitude of this waveform is reduced to ¾ of the original amplitude of FIG. 14. When higher frequency components of this waveform are cut by the low pass filter 119 of FIG. 1, a signal having a waveform 501 of FIG. 3 is obtained at the output terminal 120. That is, this waveform is obtained by multiplying the original waveform by a ratio TH/T in which T is a pulse width of the delta modulation in FIG. 2 and TH is a time duration in high level of the control signal GA. Therefore, the circuit of FIG. 1 configures a digital attenuator.

Figure 4:
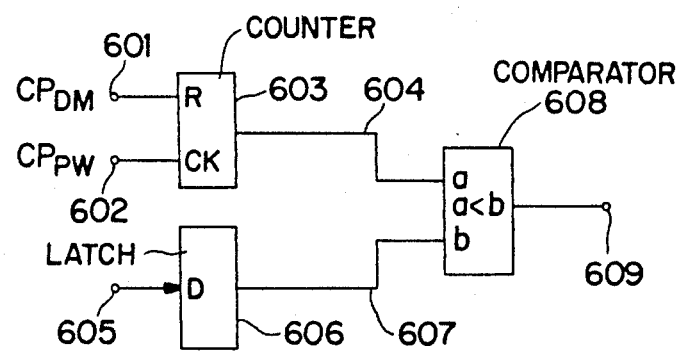
FIG. 4 shows one example of a circuit diagram for generating the control signal to perform the pulse width modulation in the circuit of FIG. 1.
Figure 5:
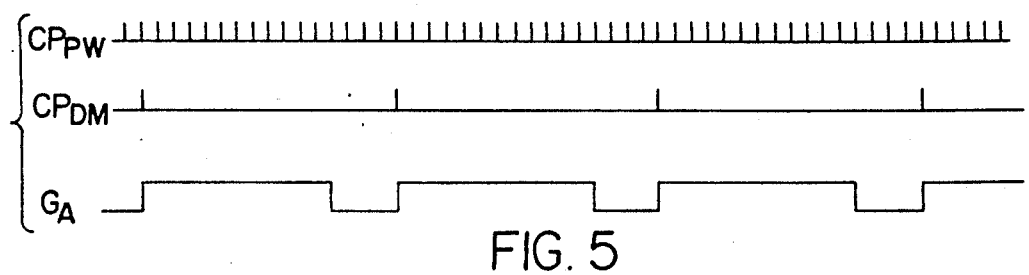
FIG. 5 shows waveforms illustrating an input signal and an output signal of the circuit shown in FIG. 4.

One example of a control signal GA generating circuit is shown in FIG. 4. This circuit is configured with a counter 603, a latch 606 and a comparator 608. The counter 603 receives an output clock $CP_{DM}$ for the delta modulation and a clock pulse $CP_{PW}$ which is more minute than the output clock $CP_{DM}$ (here, 1/16 clock). At first, a specified value (here 12) is set at the latch 606 via a signal input terminal 605. The counter 603 is reset by the clock pulse $CP_{DM}$ for the delta modulation and is counted up by the clock pulse $CP_{PW}$ for pulse width modulation. An amplitude of an output signal 604 from the counter 603 and an amplitude of an output signal 607 from the latch 606 are compared by using the comparator 608, and when the former is smaller than the latter, an output 609 of the comparator 608 becomes high level. On the contrary, when the amplitude of the signal 604 becomes larger than the amplitude held at the latch 606, the output 609 of the comparator 608 goes low level. Therefore, the control signal GA having a waveform shown in FIG. 5 can be generated. An amplitude of an analog signal obtained from decoding (or demodulating) the delta-modulated code can be controlled by the value set at the latch 606 of FIG. 4, and thus the digital attenuator can be realized.

Figure 6:
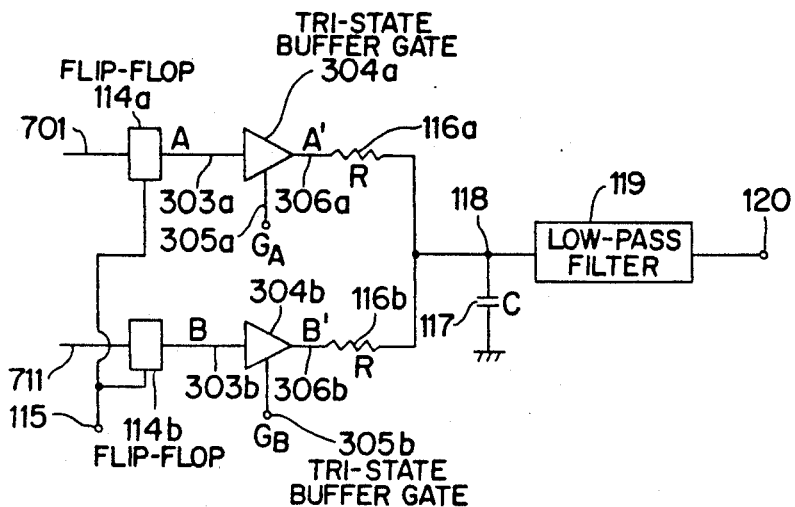
FIG. 6 is a circuit diagram showing a second embodiment of the present invention.
Figure 7:
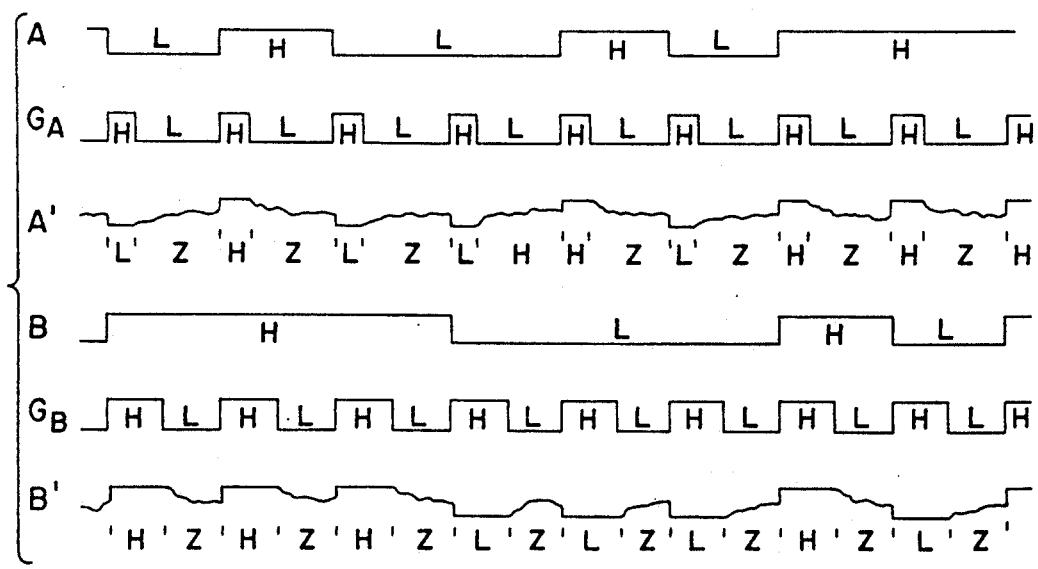
FIG. 7 shows signal waveforms at each part of the circuit of FIG. 6.

FIG. 6 is a circuit diagram showing a second embodiment of the present invention. At the time of decoding, the circuit of this second embodiment performs mixing of a plurality of code signals coded by the delta modulation system. The circuit configuration of FIG. 6 is for mixing two signals and combines two basic circuits of FIG. 1. That is, each two units of flip-flop 114, buffer gate 304 and resistance 116 of FIG. 1 are provided (114a, 304a and 116a; 114b, 304b and 116b). In this circuit configuration, combining outputs of the buffer gates 304a, 304b with relatively high resistances 116a, 116b respectively constitutes a current addition circuit, and connecting this configuration with a capacitor 117 forms an integrator. Signals A', B', which were pulse-width-modulated by the control signal GA, GB, are added and integrated by these circuits. The mixing ratio of the signals A and B is determined by the control signal GA, GB. FIG. 7 shows waveforms which results in mixing of the signal A with the ratio 0.25 and the signal B with the ratio 0.5. The control signals GA, GB can be generated by the circuit of FIG. 4, and the mixing ratio is determined with a value set at the latch 606. By using the circuit of FIG. 6, digital mixing of two signals can be performed. Needless to say, for mixing of three or more signals, provision of the number of the basic circuits corresponding to the number of the signals will suffice to implement the mixing.

Figure 8:
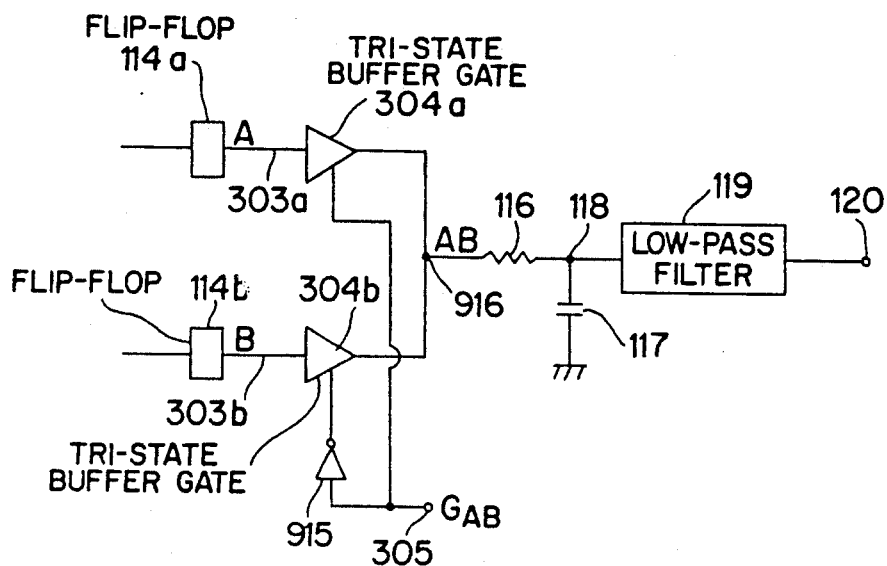
FIG. 8 is a circuit diagram showing a third embodiment of the present invention.
Figure 9:
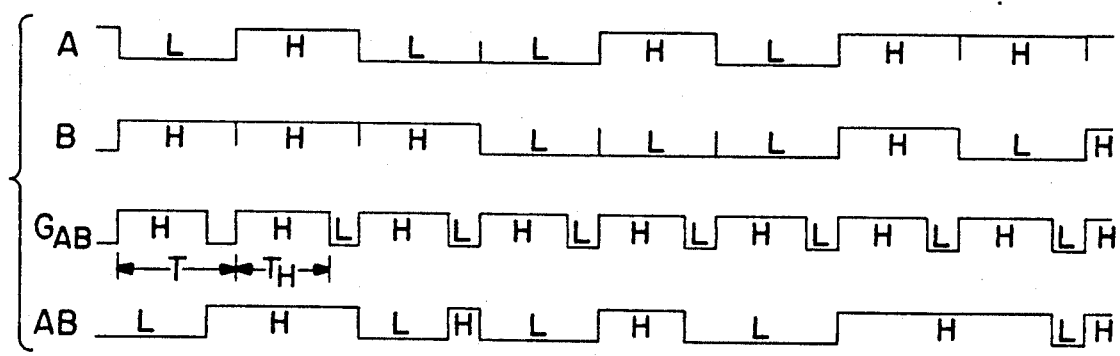
FIGS. 9 and 10 show signal waveforms at each part of the circuit of FIG. 8.

FIG. 8 is a circuit diagram showing a third embodiment of the present invention. The circuit of this embodiment is for performing connection of waveforms by fade-in fade-out of two code signals. The distinctive feature between the circuit of FIG. 6 and the circuit of FIG. 8 resides in that the buffer gate 304a and 304b are complementarily supplied with the same control signal GAB. That is, the buffer gate 304a is supplied with the control signal GAB as it is, while the buffer gate 304b is supplied with an inverted signal derived from inversion of the control signal GAB using an inverter 915. Thus, as a buffer gate output, the output from either the gate 304a or gate 304b is selected and the circuit combines the two outputs into one output signal 916 (signal designation AB). This signal is connected to a capacitor 117 through a resistance 116. As shown in the signal waveforms of FIG. 9, designating a period of the control signal GAB as T, and its duration in the high level as TH, then the two signals A and B are mixed with the ratios of TH/H and 1−(TH/T). In FIG. 9, waveforms for mixing of the signal A with the ratio ¾ and the signal B with the ratio ¼ are shown, and a mixed analog signal can be obtained by integrating the signal AB and passing the integrated signal through the low pass filter 119. Now, in the embodiment of FIG. 8, the control signal for buffer gates 304a, 304b are complementarily supplied, therefore, this portion may be replaced by logical AND OR gates.

Figure 10:
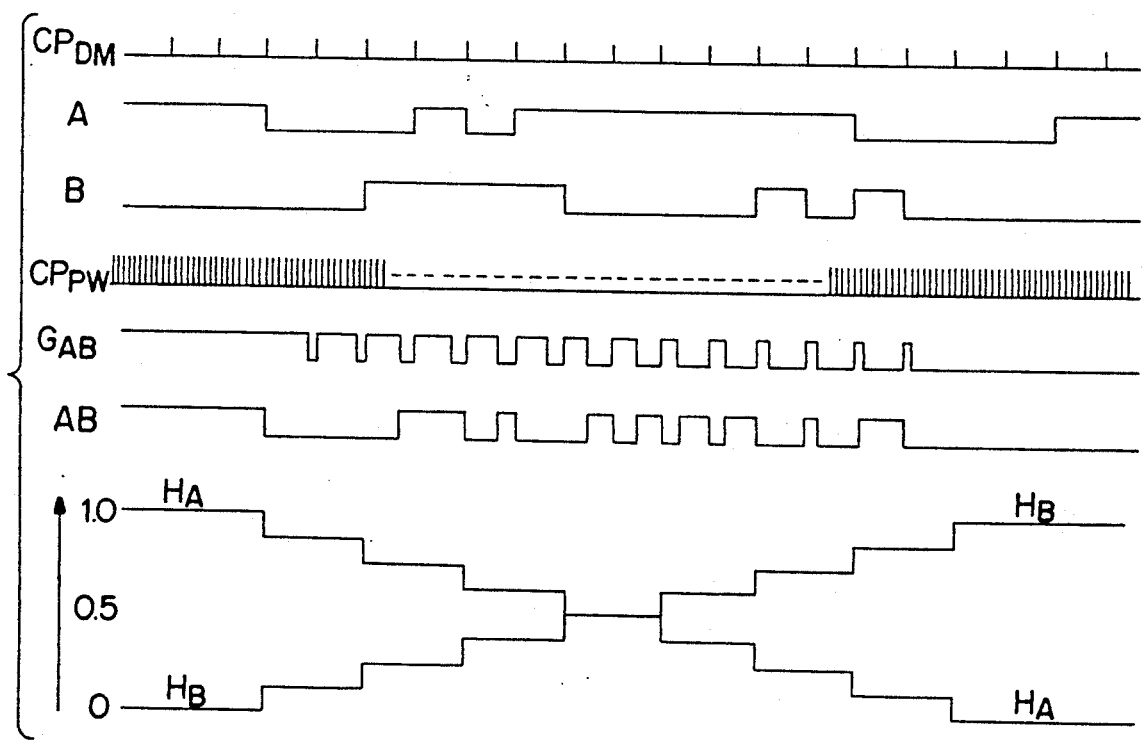
Figure 11:
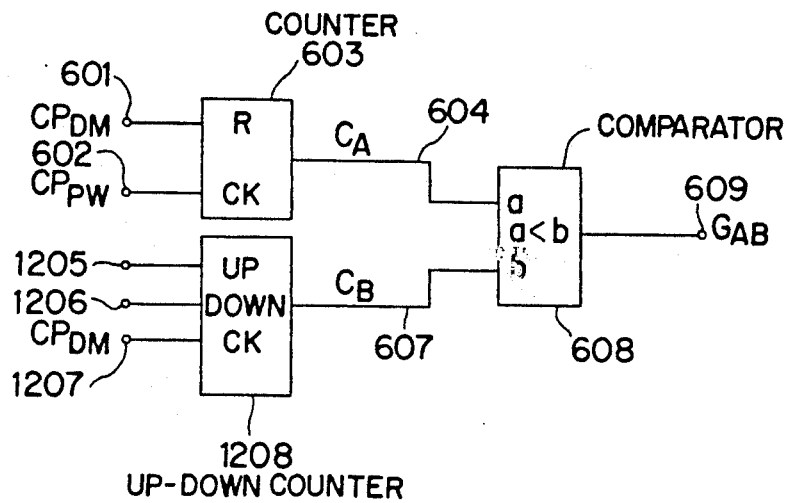
FIG. 11 shows one example of the control signal generating circuits used for the circuit of FIG. 8.
Figure 12:
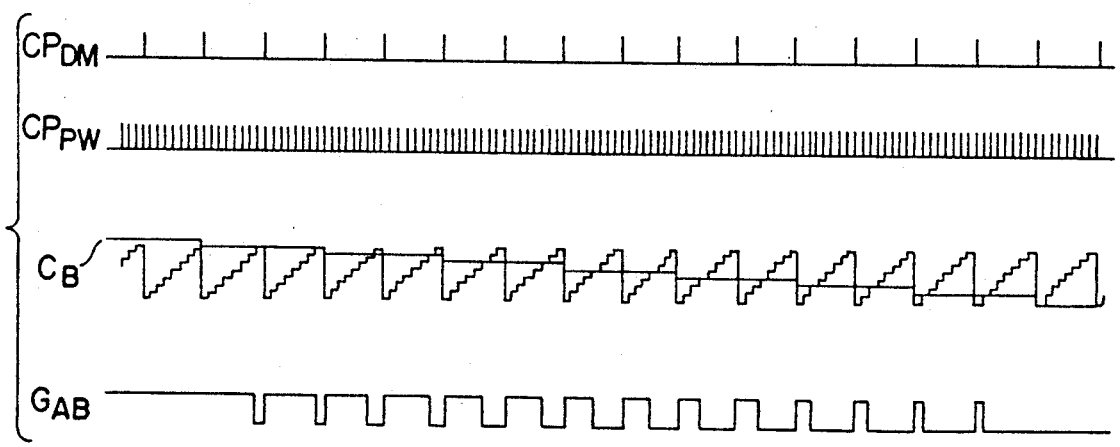
FIG. 12 shows signal waveforms at each part of the circuit of FIG. 11.

Further, as shown in FIG. 10, a gain HA of the signal A can be gradually decreased and a gain HB of the signal B can be gradually increased by gradually reducing the TH of the control signal GAB. The control signal GAB used in this operation is generated by the circuit shown in FIG. 11. This circuit is basically the same as that of FIG. 4, but uses an up-down counter 1208 of FIG. 11 in place of the latch 606 of FIG. 4. The up-down counter 1208 has more bits than the counter 603, and a high-order bit signal 607 of the up-down counter 1208 is supplied to the comparator 608. Now, as shown in FIG. 12, when a larger value than the value that the counter 603 can take is set in the up-down counter 1208, the comparator 608 always outputs a high level GAB. Then, when the control signal 1206 for down count is raised to a high level, the up-down counter 1208 is counted down by the clock pulse CPDM for the delta modulation to decrease gradually a count value. As shown in FIG. 12, the value CA of the counter 603 is counted up by the clock pulse for the pulse width modulation and reset by the clock pulse for the delta modulation, and therefore, is formed in a stepped triangle. On the other hand, when the output value CB of the up-down counter 1208 is gradually decreased, a time duration in which value CA exceeds value CB is gradually increased, and as this state goes on, a time duration in which value GAB is in a low level is increased and value GAB reaches the perfect low level when value CB becomes D and switching of fade-in fade-out from signal A to signal B is finished. On the contrary, switching from signal B to signal A is implemented by counting up the up-down counter 1208. While only certain embodiments of the present invention have been described, it will be apparent to those skilled in the art that various changes and modifications may be made therein without departing from the spirit and scope of the present invention as claimed.

What is claimed is:

1. A delta-modulation decoder, for decoding a first delta-modulated input signal represented by binary digits into a decoded analog signal, comprising:

a first flip-flop, coupled to said first delta-modulated input signal, generating as an output a first pulse signal of positive or negative pulses corresponding to the binary digits of said first delta-modulated input signal;

first pulse-width modulation means, coupled to said first flip-flop output, for limiting effective pulse width of said first pulse signal in order to generate a first pulse-width modulated pulse signal; and first integrator means, coupled to said first pulse-width modulation means, for integrating said first pulse-width modulated pulse signal to provide as output said decoded analog signal.

2. The delta-modulation decoder of claim 1, said first pulse-width modulation means comprising:

a first tri-state buffer gate, coupled to said first flip-flop output, for outputting said first pulse signal in response to a first state of a first control signal and for assuming a high impedance output state, regardless of said first pulse signal, in response to a second state of said first control signal; and first control signal generating means, coupled to said first tri-state buffer gate, for generating said first control signal.

3. The delta-modulation decoder of claim 2, said first control signal generating means comprising:

first counter means, coupled to a first delta-modulation clock signal synchronized with said first delta-modulated input signal for resetting said first counter means and coupled to a first pulse-width modulation clock signal of greater frequency than said first delta-modulation clock signal for counting up said first counter means, for generating a first counter amplitude output signal; and first latch means, coupled to a first predetermined latch input which sets said first latch means to a first predetermined value, for generating a first latch output signal; and first comparison means, coupled to said first counter amplitude signal and said first latch output signal, for outputting said first control signal of said first state when said first counter amplitude output signal is less than said first latch output signal and for outputting said first control signal of said second state when said first counter amplitude output signal is greater than said first latch output signal, whereby an amplitude of said decoded analog signal can be controlled by variation of said first predetermined latch input.

4. The delta-modulation decoder of claim 1, said first integrator means further comprising analog low-pass filter means for removing high frequency components of said decoded analog signal.

5. The delta-modulation decoder of claim 3 further comprising:
   a second flip-flop, coupled to a second delta-modulated input signal, generating as an output a second pulse signal of positive or negative pulses corresponding to binary digits of said second delta-modulated input signal; and
   second pulse-width modulation means, coupled to said second flip-flop output, for limiting effective pulse width of said second pulse signal in order to generate a second pulse-width modulated pulse signal,
   said second pulse signal coupled to said first integrator means, whereby said delta-modulation decoder mixes said first and second delta-modulation input signals to provide said decoded analog signal.

6. The delta-modulation decoder of claim 5, said second pulse-width modulation means comprising:
   a second tri-state buffer gate, coupled to said second flip-flop output, for outputting said second pulse signal in response to a first state of a second control signal and for assuming a high impedance output state, regardless of said second pulse signal, in response to a second state of said second control signal; and
   second control signal generating means, coupled to said second tri-state buffer gate, for generating said second control signal.

7. The delta-modulation decoder of claim 6, said second control signal generating means comprising:
   second counter means, coupled to a second delta-modulation clock signal synchronized with said second delta-modulated input signal for resetting said second counter means and coupled to a second pulse-width modulation clock signal of greater frequency than said second delta-modulation clock signal for counting up said second counter means, for generating a second counter amplitude output signal;
   second latch means, coupled to a second predetermined latch input which sets said second latch means to a second predetermined value, for generating a second latch output signal; and
   second comparison means, coupled to said second counter amplitude output signal and said second latch output signal, for outputting said second control signal of said first state when said second counter amplitude output signal is less than said second latch output signal and for outputting said second control signal of said second state when said second counter amplitude output signal is greater than said second latch output signal,
   whereby an amplitude of said decoded analog signal can be controlled by variation of said second predetermined latch input.

8. The delta-modulation decoder of claim 5 further comprising an inverter for inverting said first control signal to provide said second control signal.

9. The delta-modulation decoder of claim 6 further comprising:

a second flip-flop, coupled to a second delta-modulated input signal, generating as an output a second pulse signal of positive or negative pulses corresponding to binary digits of said second delta-modulated input signal; and
second pulse-width modulation means, coupled to said second flip-flop output, for limiting effective pulse width of said second pulse signal in order to generate a second pulse-width modulated pulse signal,
said second pulse signal coupled to said first integrator means, whereby said delta-modulation decoder mixes said first and second delta-modulated input signals to provide said decoded analog signal.

10. The delta-modulation decoder of claim 9, said first pulse-width modulation means comprising:
    a first tri-state buffer gate, coupled to said first flip-flop output, for outputting said first pulse signal in response to a first state of a first control signal and for assuming a high impedance output state, regardless of said first pulse signal, in response to a second state of said first control signal; and
    first control signal generating means, coupled to said first tri-state buffer gate, for generating said first control signal.

11. The delta-modulation decoder of claim 10, said second pulse-width modulation means comprising:
    a second tri-state buffer gate, coupled to said second flip-flop output, for outputting said second pulse signal in response to a first state of a second control signal and for assuming a high impedance output state, regardless of said second pulse signal, in response to a second state of said second control signal; and
    second control signal generating means, coupled to said second tri-state buffer gate, for generating said second control signal.

12. The delta-modulation decoder of claim 11, said first control signal generating means comprising:
    first counter means, coupled to a first delta-modulation clock signal synchronized with said first delta-modulated input signal for resetting said first counter means and coupled to a first pulse-width modulation clock signal of greater frequency than said first delta-modulation clock signal for counting up said first counter means, for generating a first counter amplitude output signal;
    first latch means, coupled to a first predetermined latch input which sets said first latch means to a first predetermined value, for generating a first latch output signal; and
    first comparison means, coupled to said first counter amplitude signal and said first latch output signal, for outputting said first control signal of said first state when said first counter amplitude output signal is less than said first latch output signal and for outputting said first control signal of said second state when said first counter amplitude output signal is greater than said first latch output signal,
    whereby an amplitude of said decoded analog signal can be controlled by variation of said first predetermined latch input.

13. The delta-modulation decoder of claim 12, said second control signal generating means comprising:
    second counter means, coupled to a second delta-modulation clock signal synchronized with said second delta-modulated input signal for resetting said second counter means and coupled to a second pulse-width modulation clock signal of greater frequency than said second delta-modulation clock signal for counting up said second counter means, for generating a second counter amplitude output signal;

second latch means, coupled to a second predetermined latch input which sets said second latch means to a second predetermined value, for generating a second latch output signal; and second comparison means, coupled to said second counter amplitude output signal and said second latch output signal, for outputting said second control signal having said first state when said second counter amplitude output signal is less than said second latch output signal and for outputting said second control signal having said second state when said second counter amplitude output signal is greater than said second latch output signal, whereby an amplitude of said decoded analog signal can be controlled by variation of said second predetermined latch input.

14. A delta-modulation decoder, for decoding a plurality of delta-modulated input signals represented by binary digits into a decoded analog signal, comprising:

a plurality of flip-flops, each coupled to a respective one of said delta-modulated input signals, generating respective pulse output signals of positive or negative pulses corresponding to the respective binary digits of the respective delta-modulated input signals;

a plurality of pulse width modulation means, each one connected to a respective one of said flip-flop outputs, limiting effective pulse width of said respective pulse output signals in order to generate respective pulse-width modulated pulse signals; and integrator means, coupled to said plurality of pulse-width modulation means, integrating said respective pulse output signals to provide as output said decoded analog signal, said delta-modulation decoder mixes said plurality of delta-modulated input signals to provide said decoded analog signal.

15. A delta-modulation decoder, for decoding first and second delta-modulated input signals represented by binary digits, into a decoded analog signal, comprising:

a first flip-flop, coupled to said first delta-modulated input signal, generating as an output a first pulse signal of positive or negative pulses corresponding to the respective binary digits of the first delta-modulated input signal;

a second flip-flop, coupled to said second delta-modulated input signal, generating as an output a second pulse signal of positive or negative pulses corresponding to the respective binary digits of the second delta-modulated input signal;

a first pulse-width modulation means, coupled to said first flip-flop output, limiting effective pulse width of said first pulse signal in order to generate a first pulse-width modulated pulse signal;

a second pulse-width modulation means, coupled to said second flip-flop output, limiting effective pulse width of said second pulse signal in order to generate a second pulse-width modulated pulse signal; and integrator means, coupled to said first and second pulse-width modulation means, integrating said first and second pulse-width modulated pulse signals to provide as output a decoded analog signal.

16. The delta-modulation decoder of claim 15, said first pulse-width modulation means comprising a first tri-state buffer gate, coupled to said first flip-flop output, outputting said first pulse signal in response to a first state of a first control signal and for assuming a high impedance output state, regardless of said first pulse signal, in response to a second state of said first control signal; and said second pulse-width modulation means comprising a second tri-state buffer gate, coupled to said second flip-flop output, outputting said second pulse signal in response to a first state of a second control signal and for assuming a high impedance state, regardless of said second pulse signal, in response to a second state of said second control signal.

17. The delta-modulation decoder of claim 16 further including a control signal generating means comprising:

counter means, coupled to a delta-modulation clock signal synchronized with said first and second delta-modulated input signals for resetting said first counter means and coupled to a first pulse-width modulation clock signal of greater frequency than said delta-modulation clock signal for counting up said counter means, for generating a counter amplitude output signal;

up-down counter means, for gradually counting up or down, in response to an up-count signal or a down-count signal, to provide a gradually increasing or decreasing high-order bit signal;

comparison means, coupled to said counter amplitude output signal and said high-order bit signal, for outputting said first control signal of said first state when said counter amplitude output signal is less than said high-order bit signal and for outputting said first control signal of said second state when said counter amplitude output signal is greater than said high order bit signal; and inverter means, coupled to said comparison means for inverting said first control signal to provide said second control signal.

18. A method of decoding a delta-modulated signal represented by binary digits into a decoded analog signal comprising the steps of:

generating a pulse signal of positive or negative pulses corresponding to the binary digits of said delta-modulated input signal;

pulse-width modulating said pulse signal to generate a pulse-width modulated pulse signal; and integrating said pulse-width modulated pulse signal to provide as output said decoded analog signal.

* * * * *

UNITED STATES PATENT AND TRADEMARK OFFICE
CERTIFICATE OF CORRECTION

PATENT NO. : 5,043,729

DATED : August 27, 1991

INVENTOR(S) : Yoshiji FUJIMOTO

It is certified that error appears in the above-identified patent and that said Letters Patent is hereby corrected as shown below:

Column 7, (claim 9) line 67, change "6" to --1--.

Signed and Sealed this

Fifth Day of January, 1993

Attest:

DOUGLAS B. COMER

Attesting Officer

Acting Commissioner of Patents and Trademarks